(12) United States Patent
Ackermann et al.

(10) Patent No.: US 9,074,798 B2
(45) Date of Patent: Jul. 7, 2015

(54) TUBULAR THERMAL SWITCH FOR THE CRYO-FREE MAGNET

(75) Inventors: Robert A. Ackermann, Schenectady, NY (US); Philippe A. Menteur, Niskayuna, NY (US)

(73) Assignee: KONINKLIJKE PHILIPS N.V., Einhoven (NL)

( * ) Notice: Subject to any disclaimer, the term of this patent is extended or adjusted under 35 U.S.C. 154(b) by 226 days.

(21) Appl. No.: 13/514,310

(22) PCT Filed: Dec. 7, 2010

(86) PCT No.: PCT/IB2010/055635
§ 371 (c)(1), (2), (4) Date: Jun. 7, 2012

(87) PCT Pub. No.: WO2011/080630
PCT Pub. Date: Jul. 7, 2011

(65) Prior Publication Data
US 2013/0023418 A1 Jan. 24, 2013

Related U.S. Application Data

(60) Provisional application No. 61/290,270, filed on Dec. 28, 2009.

(51) Int. Cl.
*H01L 39/02* (2006.01)
*F25D 31/00* (2006.01)
(Continued)

(52) U.S. Cl.
CPC ............... *F25B 9/10* (2013.01); *F25D 19/006* (2013.01); *G01R 33/3804* (2013.01); *H01F 6/04* (2013.01)

(58) Field of Classification Search
CPC ........ F17C 13/00; F17C 13/007; F25B 19/00; F25B 19/04; F25B 9/00; F25D 31/00; F25D 19/006; F28D 15/00; G01R 33/035; G01R 33/383; G01R 33/3804; G01R 33/3815; G01R 33/54; H01L 39/02; H01F 6/04
USPC ........ 505/162, 163, 892, 893; 62/259.2, 51.1, 62/6, 62; 324/318, 309; 335/216, 200; 165/104.21, 96
See application file for complete search history.

(56) References Cited

U.S. PATENT DOCUMENTS

| 4,277,949 A | 7/1981 | Longsworth |
| 4,986,077 A | 1/1991 | Saho et al. |

(Continued)

FOREIGN PATENT DOCUMENTS

| EP | 0350268 A2 | 5/1997 |
| GB | 2313182 A | 11/1997 |

(Continued)

OTHER PUBLICATIONS

Jeong et al, "Experimental investigation on the detachable thermosiphon for conduction-cooled superconducting magnets," Cryogenics, vol. 46, Issue 10, 2006, pp. 705-710.*

(Continued)

*Primary Examiner* — Stanley Silverman
*Assistant Examiner* — Kallambella Vijayakumr

(57) ABSTRACT

When cooling a superconducting magnet for use in a magnetic resonance imaging (MRI) device, a two-stage cryocooler (42) employs a first stage cooler (52) to cool a working gas (e.g., Helium, Hydrogen, etc.) to approximately 25 K. The working gas moves through a tubing system by convection until the magnet (20) is at approximately 25K. Once the magnet (20) reaches 25 K, gas flow stops, and a second stage cooler (54) cools the magnet (20) further, to about 4 K.

20 Claims, 3 Drawing Sheets

(51) Int. Cl.
*G01R 33/48* (2006.01)
*F25B 9/10* (2006.01)
*F25D 19/00* (2006.01)
*G01R 33/38* (2006.01)
*H01F 6/04* (2006.01)

(56) References Cited

U.S. PATENT DOCUMENTS

| | | |
|---|---|---|
| 5,412,363 A | 5/1995 | Breneman et al. |
| 5,461,873 A * | 10/1995 | Longsworth .................. 62/51.1 |
| 6,173,761 B1 * | 1/2001 | Chandratilleke et al. ........................ 165/104.21 |
| 6,396,377 B1 | 5/2002 | Ying |
| 6,437,568 B1 * | 8/2002 | Edelstein et al. ............. 324/318 |
| 6,443,225 B1 | 9/2002 | Nakanou |
| 6,990,818 B2 | 1/2006 | Hofmann |
| 2005/0062473 A1 | 3/2005 | Ryan |
| 2008/0209919 A1 * | 9/2008 | Ackermann et al. ........... 62/51.1 |
| 2009/0007573 A1 | 1/2009 | Noonan et al. |
| 2011/0179809 A1 | 7/2011 | Zhang |

FOREIGN PATENT DOCUMENTS

| | | |
|---|---|---|
| JP | 10089867 A | 4/1998 |
| JP | 11354317 A | 12/1999 |
| JP | 2000055492 A | 2/2000 |

OTHER PUBLICATIONS

Jeong, S., et al.; Experimental investigation on the detachable thermosiphon for conduction-cooled superconducting magnets; 2006; Cryogenics; 46(10)705-710.

* cited by examiner

TUBULAR THERMAL SWITCH FOR THE CRYO-FREE MAGNET

CROSS REFERENCE TO RELATED APPLICATIONS

This application claims the benefit of U.S. provisional application Ser. No. 61/290,270 filed Dec. 28, 2009, which is incorporated herein by reference.

The present application finds particular utility in cooling procedures and systems for cooling superconductors below their critical temperature, e.g. superconducting magnetic resonance imaging or spectroscopy magnets. However, it will be appreciated that the described technique(s) may also find application in other types of medical systems, other cooling systems, and/or other cooling applications.

Conventional cooling systems for cooling a superconducting MRI magnet employ large dewar filled with liquid cryogenic fluid (e.g., liquid helium, or the like), which is expensive and take up significant space.

During initial cooling, helium gas and the magnet are typically cooled to about 25 Kelvin (K) with a first stage cooler. A second stage cooler cools the helium from 25 K to its 4.2 K condensation temperature.

Once temperatures below 25 K have been achieved, the warmer 25 K first stage is thermally disconnected from the second stage. Effective thermal switching at temperatures around 25 K can be awkward and complex.

There is an unmet need in the art for systems and methods that facilitate thermally switching the first stage of a two-stage regenerative cryo-cooling system for an MRI magnet.

In accordance with one aspect, a cryo-cooling system that facilitates passively switching between first and second cooling stages to cool a superconductor includes a first stage cooler, a first heat exchanger thermally coupled to the first stage cooler, a second stage cooler, and a second heat exchanger thermally coupled to the second stage cooler. The system further includes a down flow tube through which denser, cooled gas flows from the first heat exchanger down to the second heat exchanger, and an up flow tube through which less dense, warmer gas flows from the first heat exchanger up to the second heat exchanger when the second heat exchanger is warmer than the first stage heat exchanger. Additionally, the system includes a superconductor thermally coupled to the second heat exchanger.

In accordance with another aspect, a method of cooling a superconductor to a superconducting temperature includes cooling a working gas to a first stage temperature, using a first stage cooler, permitting the cooled working gas to flow downward form a first heat exchanger to a second heat exchanger in thermal contact with the superconductor and absorb heat therefrom, and permitting warmed working gas to flow upward from the second heat exchanger to the first heat exchanger. The method further includes dissipating heat from the warmed working gas and re-cooling the working gas to the first stage temperature, and, once the second heat exchanger reaches approximately the first stage temperature, employing a second stage cooler thermally coupled to the superconductor to cool the superconductor down to a superconducting temperature.

According to another aspect, an apparatus for cooling a superconducting magnet to an operating temperature includes means for cooling a working gas to approximately 25 K, and means for permitting the working gas circulate and carry heat away from the superconducting magnet via convection until the superconducting magnet is approximately 25 K. The apparatus further includes means for cooling the superconducting magnet from approximately 25 K down to approximately 4 K, and maintaining the superconducting magnet at approximately 4 K during operation.

One advantage is that the switching operation is passive and requires no mechanical or moving parts.

Another advantage is that thermal isolation between the cryocooler first stage and the magnet at approximately 4 Kelvin (K) is maximized.

Another advantage resides in high pressure, dense gas operation over the full temperature range.

Still further advantages of the subject innovation will be appreciated by those of ordinary skill in the art upon reading and understand the following detailed description.

The drawings are only for purposes of illustrating various aspects and are not to be construed as limiting.

Figure 1:
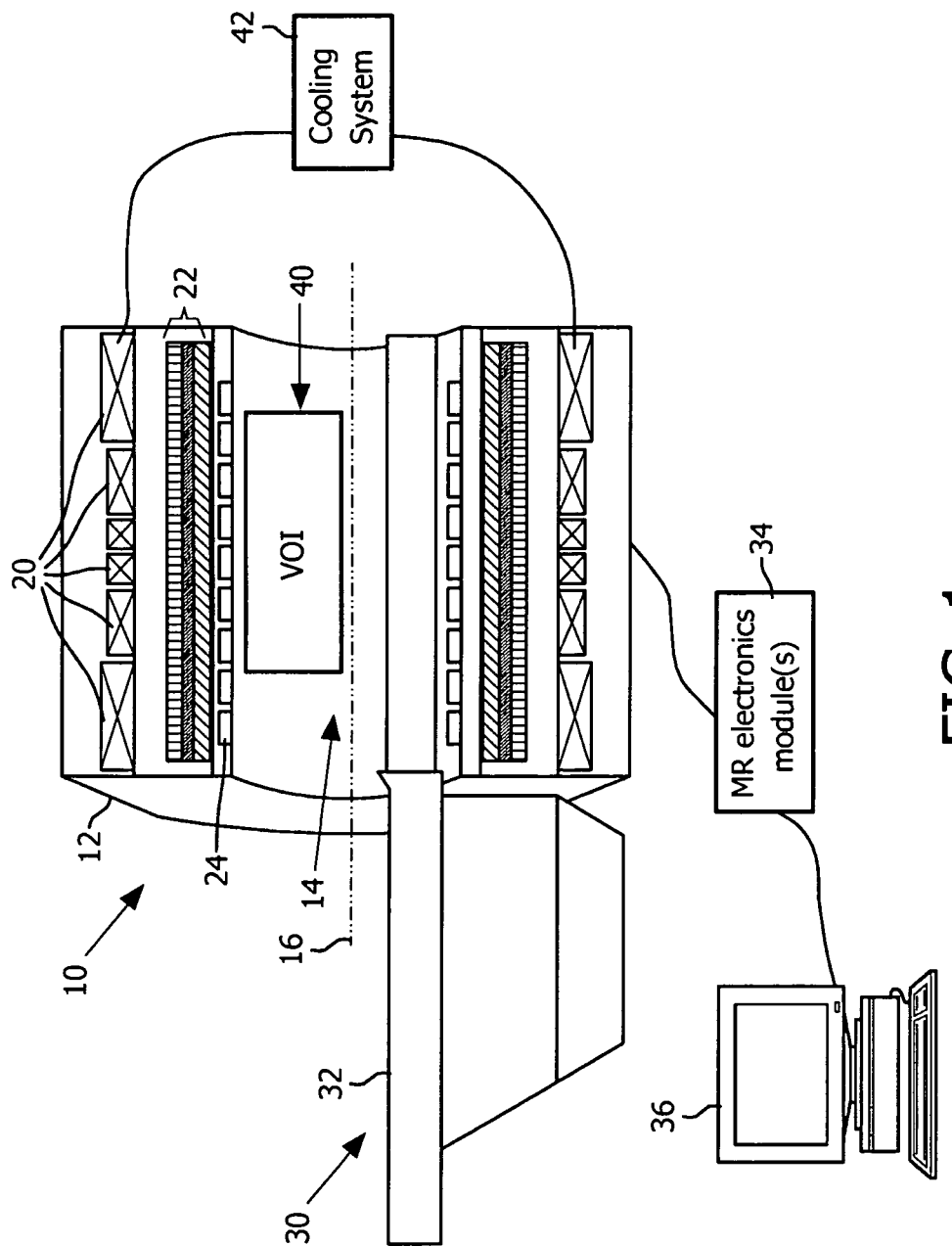
FIG. 1 illustrates a magnetic resonance (MR) system that includes two-stage cryo-cooling system, which is shown in partial cross-section in to diagrammatically reveal selected internal components.

Systems and methods are disclosed herein for cooling an MRI magnet or other superconductor to its superconducting temperature, such as approximately 4 K, using a two-stage cryocooler with a tubular thermal switch that passively thermally disconnects a first stage of the system and activates a second stage of the system at a selected temperature, e.g. approximately 25 K. With reference to FIG. 1, a magnetic resonance (MR) system includes an MR scanner 10 comprising a generally cylindrical or toroidal housing 12, which is shown in partial cross-section in FIG. 1 to diagrammatically reveal selected internal components. The housing 12 defines a bore 14 that is concentric with a cylinder or toroid axis 16 of the housing 12. A subject is received in the bore 14 for imaging. A thermally shielded main magnet 20 defined by solenoidal conductive windings generates a static ($B_0$) magnetic field with the field direction generally parallel with the cylinder or toroid axis at least within an examination region of the bore 14. The windings of the main magnet 20 are superconducting; are thermally isolated, such as by a vacuum chamber or dewar containing helium gas or other working gas (e.g., a heat-exchanging gas), and other forms of thermal insulation to minimize heating.

The housing 12 further contains or supports a plurality of magnetic field gradient windings 22 for superimposing magnetic field gradients in selected directions within the examination region of the bore 14. The magnetic field gradients are in general time-varying. As an illustrative example, a slice-selective magnetic field gradient may be applied along the axis 16 of the bore during magnetic resonance excitation to select an axial slice, followed by a quiescent period during which a phase-encoding magnetic field gradient is applied transverse to the axial slice, followed by a readout period during which a frequency-encoding magnetic field gradient is applied in a direction transverse to both the axis 16 and the phase encoding direction. In more complex sequences such as echo-planar imaging (EPI), sinusoidal or other rapidly time-varying magnetic field gradients may be applied by selective energizing of the gradient windings 22.

The magnetic resonance excitation is generated by applying a radiofrequency ($B_1$) pulse at the magnetic resonance frequency (e.g., 128 MHz for ¹H excitation in a 3.0T field) to one or more radio frequency coils 24. In the illustrative embodiment, the radio frequency coil 24 is a "whole-body" volume coil such as a birdcage coil or transverse electromagnetic (TEM) coil arranged on or in the housing 12 concentric with the axis 16. More generally, a local coil or coil array such as a head coil, limb coil, surface coil, or so forth is used for the MR excitation. The MR readout may be performed using the same coil or coils 24 as is used for the excitation, or the MR readout may be performed by a different radio frequency coil or coils (not shown).

In the illustrative embodiment, a patient loading system includes a patient couch 30 arranged at an end of the housing 12 so that a patient on a bed 32 can be transferred into the bore 14 of the MR scanner 10. The MR system further includes suitable MR electronic modules 34 for controlling the MR scanner 10 to acquire MR data and to process the acquired MR data. For example, the MR electronic modules 34 may include an image reconstruction module, a spectroscopy module, or the like. A computer or graphic user interface 36 provides user interfacing with the MR system, and may also embody some or all of the MR electronic modules 34 as software executing on the computer 36. In this manner, the MR scanner 10 generates images of a volume of interest (VOI) 40 positioned within the examination region of the bore 14.

The MR system also includes a magnet cooling system or cryocooler 42 that can operate without liquid helium. To achieve the low (e.g., about 4 K) temperatures employed to bring the superconducting magnets 20 to their superconducting temperature, the cooling system 42 includes a first stage 52 which cools to about 25 K (or other selected temperature) and a second stage 54 which cools to about 4 K (or some other predefined temperature). During initial cool down of the magnet, it is advantageous to use the first stage cooler to bring the magnet down to about 25 K and then switch over to the second stage cooler to bring the magnet down to about 4 K. The cooling system 42 couples the first and second stages in such a manner that it passively switches thermal communication with the first stage on and off, as described in greater detail with regard to FIG. 2.

The illustrative MR scanner 10 is an example. Approaches disclosed herein for cooling cryo-free magnets in MR scanner systems may be applicable with any types of MR scanner, including the illustrated horizontal cylindrical bore scanner 10, or an open MR scanner, vertical-magnet MR scanner, or so forth, as well as other scanners that operate at cryogenic temperatures.

Figure 2:
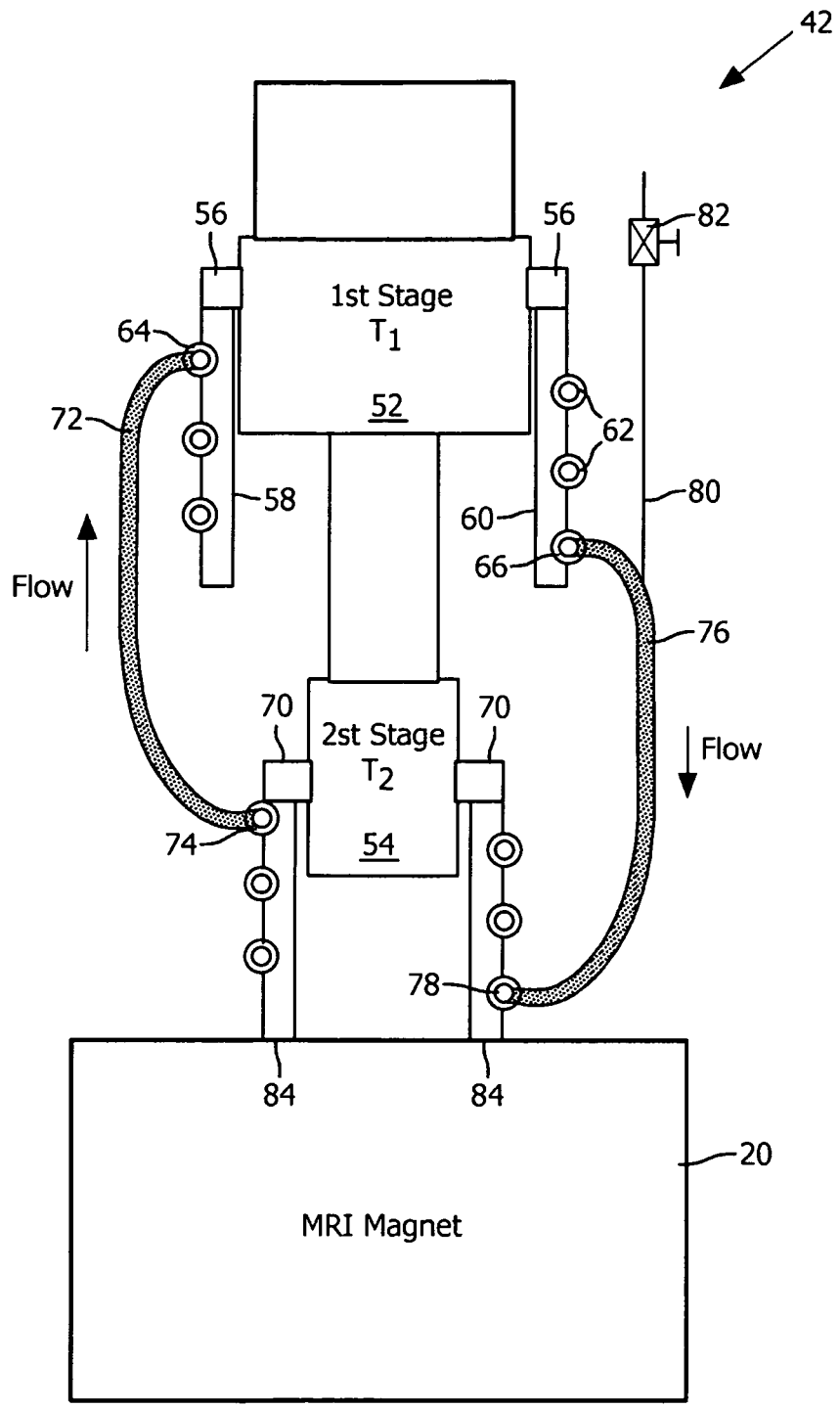
FIG. 2 illustrates a two-stage cryo-cooling system with a tubular thermal switch, in accordance with various embodiments described herein.

FIG. 2 illustrates an embodiment of the cooling system 42. The system is a two-stage regenerative cryocooler in which the first stage cooler 52 cools a working gas (and thereby the magnet 20) to a first temperature (e.g., approximately 25 K), and the second stage cooler 54 that turns on when the magnet reaches the first temperature and continues to cool the working gas and the magnet down to a second temperature (e.g., approximately 4 K). The first stage includes a heat exchanger 56 (e.g., formed of copper or the like), having a "high" side 58 and a "low" side 60. A helically or spirally wound tube 62 wraps around the first stage heat exchanger from a high port 64 on the high side 58 to a low port 66 on the low side. A tube is also wound helically or spirally around a second stage heat exchanger 70.

An up flow tube 72 connects a high port 74 of the second heat exchanger with the high port 64 of the first heat exchanger 56. A down flow tube 76 is coupled to the low port 66 on the low side 60 of the first stage heat exchanger 56, and to a low port 78 on a low side of the second stage heat exchanger 70. A charging tube 80 with a valve thereon is coupled to this closed loop system, such as to the down flow tube 76. When the valve is opened, pressurized heat exchanger gas (e.g., "working" gas) such as helium is added to the cooling system 42 to prime the system for operation. When in operation, heat exchanger gas flows between the first stage cooler 52 and the second heat exchanger 70. A lower end 84 of the second stage heat exchanger 70 is thermally coupled (e.g., directly or indirectly) to the magnet 20 and transfers heat away from the magnet.

When the second heat exchanger 70 is warmer than the first heat exchanger 56, chilled, more dense heat exchanger gas (or condensed liquid) flows through the down tube 76 to the low end of the second, warmer heat exchanger. As the heat exchanger gas draws heat out of the second heat exchanger, it warms becoming less dense. The less dense heat exchanger gas rises to the upper port 74 at the uppermost end of the second heat exchanger stage and through the up flow tube to the upper most port 64 of the first heat exchanger. As the heat exchanger gas is cooled by the first stage 52, it becomes denser and flows down to the lower most port 66 of the first heat exchanger and down the down flow tube 76. In this manner, the thermal gradient between the first and second heat exchangers causes the heat exchanger gas to circulate.

Once the first and second heat exchangers reach equilibrium, there is no density change in the heat exchanger gas and the circulation stops. The second stage 54 then starts cooling the second heat exchanger 70 to colder temperatures. Because the heat exchanger gas in the second heat exchanger is the coldest, it is the densest and does not rise to the first heat exchanger, i.e. circulation remains stopped. The second stage 54 continues to cool the second heat exchanger to the superconducting or critical temperature. The second heat exchanger can be thermally connected with the magnet by thermally conductive solids or materials, and conducts heat away from the magnet. When the working gas is heated, it rises to the second heat exchanger to be re-cooled. This circulation continues to maintain the magnet at or below the critical temperature.

In one embodiment, the first stage cools the first heat exchanger down to about 25 K and the tubing is filled with a heat exchanger gas which remains in its gaseous stage at least down to about 25 K, and is sealed. When the magnet 20 is above 25 K, the gas cooled by the first stage cooler 52 flows by gravity through the flow tube to the coil tubes adjacent the second stage and the MRI magnet. The gas in the coils coupled the second stage heat exchanger 70 is warmed by the magnet when the magnet is about 25 K. The warmed gas flows from the second stage heat exchanger 70 and rises through the up flow tube 62 due to the density difference between warm and cold gas, back to the first stage heat exchanger 56, where it is again cooled. In this manner, the heat exchanger gas continues to cycle until the MRI magnet is cooled to about 25 K at which circulation of the heat exchanger gas stops. The second stage then cools the magnet below 25 K to about 4 K.

Heat is transferred from the second heat exchanger via the up flow tube to the first heat exchanger through natural convection of a gas in the up flow tube, because the second stage is at a higher elevation than the first stage. This orientation produces a gravity-induced circulation of the cold dense gas from the upper heat exchanging to the lower and the return of the warm gas heated in the lower end. The circulation stops if the lower end of the tube becomes colder than the upper end. Adapting this phenomenon to the first and second stages of a cryocooler enables the most effective use of the cryocooler over the entire cooling range from room temperature down to about 4.2 K.

The cooling characteristic of the two stage regenerative cryocooler lends itself to the use of such a thermal switch. The first stage cooler 52 is designed to provide more cooling capacity than the second stage cooler 54 over the temperature range from about 300 K to about 25 K. The second stage 54 of the cryocooler provides more cooling capacity from about 25 K to about 4 K. Therefore, to provide maximum cooling to the magnet 20 over the entire range from about 300 K to about 4 K, the magnet is thermally attached to the first stage cooler 52 during the initial cooldown from 300 K, and then isolated from the first stage cooler 52 after the magnet is cooled below about 25 K.

The gas tube arrangement provides this capability when the tube is filled with a low-boiling point temperature gas. This includes gases such as helium, hydrogen, neon and nitrogen. Hydrogen and helium are effective because of their superior heat transfer properties and low boiling point temperatures. Additionally, to achieve the maximum thermal efficiency from the passive switch, the heat transfer at the upper and lower ends of the tube arrangement is maximized. That is, the tubular design disclosed herein enables optimum thermal performance through spiral-wound (e.g., helical) heat exchanges mounted to the first and second stages of the cryocooler.

Moreover, it will be appreciated that the first and second temperatures described here (e.g., 25 K and 4 K, respectively) are illustrative in nature and that the described systems and methods are not limited to these temperatures. Rather, the first stage cooler may cool the heat exchanger gas to another selected temperature. That is, the first and second temperatures are only limited by the boiling point of the particular gas or gases used. So long as the selected gas remains in a gaseous state at the first temperature, and at a predetermined pressure (e.g., 500 psi or some other predefined pressure), it is suitable for use in the described systems and methods. For instance, if Nitrogen gas is used as the heat exchanger gas, the first temperature is approximately 60 K, below which the $N_2$ gas flow stops circulating and the second stage cooler takes over cooling the magnet down to the final operating temperature (e.g., the second temperature).

FIG. 2 thus illustrates a conceptual design for a tubular passive thermal switch. The switch comprises the two heat exchangers 56, 70 respectively mounted to the cryocooler first stage 52, and the cryocooler second stage 54 which is thermally coupled to the MRI magnet 20. The down flow tube 76 and the up flow tube 62 are connected to the two heat exchangers providing a flow circuit for the gas contained in the tubes. In one embodiment, the heat exchangers are fabricated by spirally winding the tubes onto copper cooling plates attached to the cryocooler and magnet and/or second stage. The design produces an efficient heat transfer switch that cools the magnet 20 through gravity-induced thermal convection when the first stage of the cryocooler is colder than the magnet, and isolates the magnet by stopping the flow once the magnet and second stage become colder than the cryocooler first stage. The tubular design is simpler than conventional approaches and permits the use of a high pressure, dense gas with minimal structural limitations. The passive operation of the system requires no mechanical interaction to regulate the switch between transferring and not transferring heat.

Figure 3:
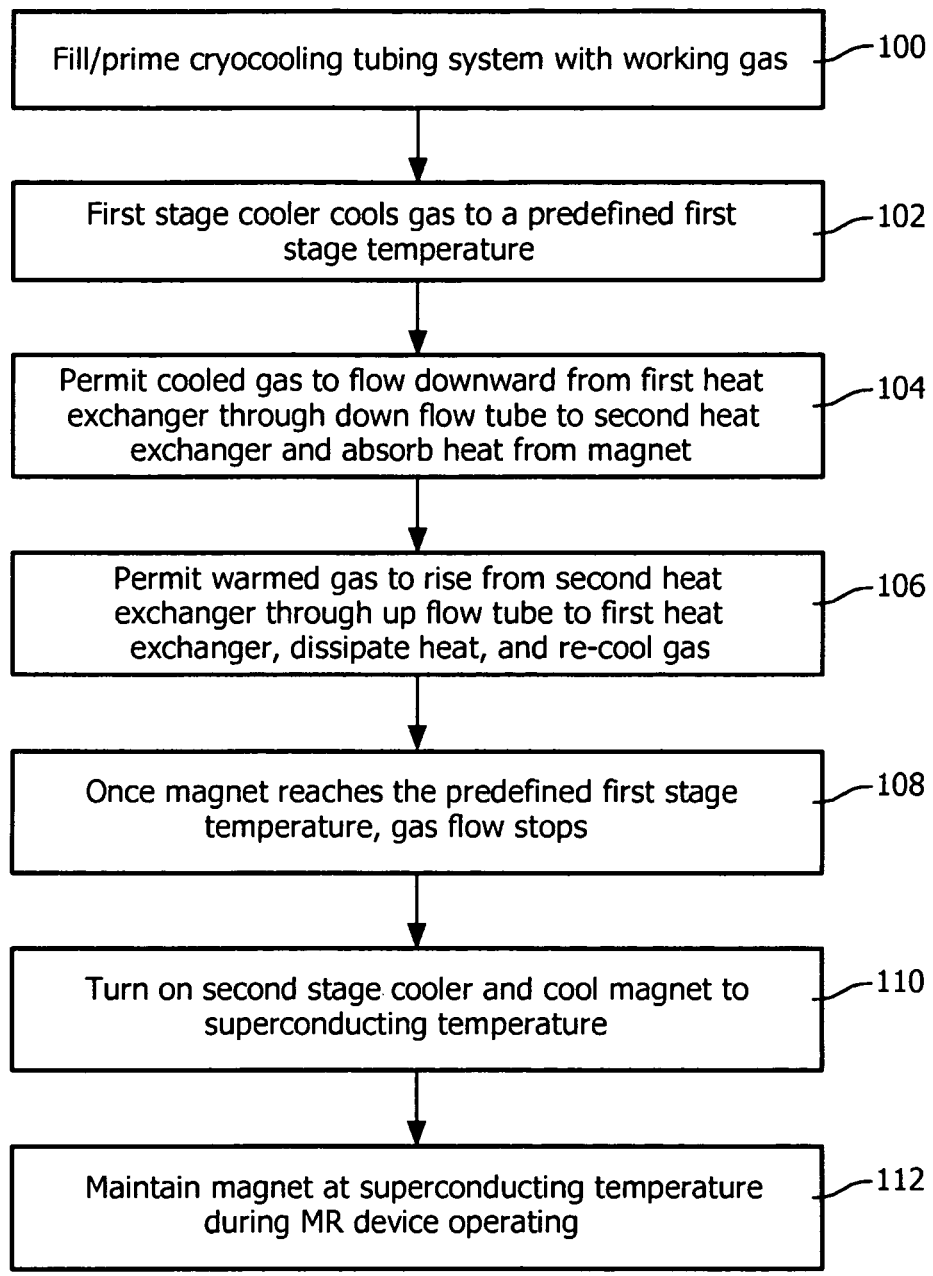
FIG. 3 illustrates a process flow for passively regulating a thermal switch used to control operation of a two-stage cryo-cooler to cool an MRI magnet from room temperature down to approximately 4 K, in accordance with one or more aspects described herein.

FIG. 3 illustrates a process flow for passively regulating a thermal switch used to control operation of a two-stage cryocooler to cool an MRI magnet or other low temperature superconductor from room temperature down, for example, to approximately 4 K, in accordance with one or more aspects described herein. At 100, a cryocooler tubing system is filled with a working gas (e.g., hydrogen, helium, nitrogen, neon, or the like). At 102, a first stage cooler cools gas passing through or near it, down a first stage temperature, e.g. 25 K. At 104, cold gas falls through a down flow tube to a second stage heat exchanger, where the gas absorbs heat from an MR magnet. At 106, warmed gas rises through an up flow tube back to the first stage heat exchanger, where heat is dissipated and the first stage cooler re-cools the gas. This process continues until the magnet and second stage heat exchanger reach the first stage temperature.

At 108, once the magnet and second stage heat exchanger are at or below first stage temperature, flow through the tubes stops. Because the temperature of the first stage cooler and heat exchanger are equal to or greater than the temperature of the second stage components and the MRI magnet, the gas stops absorbing heat from the second stage heat exchanger and rising to the first stage. The second stage cooler turns on, at 110, and cools the magnet down to its superconducting temperature, e.g. approximately 4 K. The second stage cooler maintains the superconducting temperature during operation of an MR device in which the magnet is employed, at 112.

The innovation has been described with reference to several embodiments. Modifications and alterations may occur to others upon reading and understanding the preceding detailed description. It is intended that the innovation be construed as including all such modifications and alterations insofar as they come within the scope of the appended claims or the equivalents thereof.

Having thus described the preferred embodiments, the invention is now claimed to be:

1. A cryo-cooling system that facilitates passively switching between first and second cooling stages to cool a superconductor, including:
    a first stage cooler;
    a first heat exchanger thermally coupled to the first stage cooler;
    a second stage cooler; a second heat exchanger thermally coupled to the second stage cooler;
    a down flow tube through which denser, cooled gas flows from the first heat exchanger down to the second heat exchanger;
    an up flow tube through which less dense, warmer gas flows from the first heat exchanger up to the second heat exchanger when the second heat exchanger is warmer than the first stage heat exchanger; and
    a superconductor thermally coupled to the second heat exchanger.

2. The system according to claim 1, wherein the down flow tube is coupled to a lower port on a low side of the first heat exchanger, and to a lower port on a low side of the second heat exchanger.

3. The system according to claim 1, wherein the up flow tube is coupled to an upper port on a high side of the first heat exchanger, and to an upper port on a high side of the second heat exchanger.

4. The system according to claim 1, wherein the gas is Helium gas.

5. The system according to claim 1, wherein the gas is one of Hydrogen gas, Neon gas, or Nitrogen gas.

6. The system according to claim 1, wherein the first stage cooler cools the gas to approximately 25 degrees Kelvin (K).

7. The system according to claim 6, wherein cold gas flows downward by gravity through the down flow tube from the low side of the first heat exchanger to the low side of the second heat exchanger, absorbs heat from the superconductor while the superconductor is warmer than approximately 25 degrees K, the warmer gas that has absorbed heat from the superconductor rises through the up flow tube from the high side of the second heat exchanger to the high side of the first heat exchanger, and heat is dissipated and the gas is cooled back to approximately 25 degrees K in the first heat exchanger.

8. The system according claim 7, wherein gas flow ceases when the superconductor reaches approximately 25 degrees K, and the second stage cooler cools the second heat exchanger to approximately 4 degrees K, thereby cooling the superconductor to approximately 4 degrees K.

9. The system according to claim 8, wherein the second stage cooler maintains the superconductor at approximately 4 degrees K.

10. The system according to claim 1, wherein the cryocooling system is coupled to a magnetic resonance (MR) device in which the superconductor includes a superconducting magnet employed to generate a magnetic field.

11. A magnetic resonance system, comprising:
a superconducting magnet, which generates a steady state magnetic field through an examination region;
the cryocooling system according to claim 1;
at least one radio frequency coil that receives signals from the examination region; and
an electronic module that processes the magnetic resonance signals.

12. A method of cooling a superconductor to a superconducting temperature, including:
cooling a working gas to a first stage temperature, using a first stage cooler;
permitting the cooled working gas to flow downward form a first heat exchanger to a second heat exchanger in thermal contact with the superconductor and absorb heat therefrom;
permitting warmed working gas to flow upward from the second heat exchanger to the first heat exchanger;
dissipating heat from the warmed working gas and re-cooling the working gas to the first stage temperature;
once the second heat exchanger reaches approximately the first stage temperature, employing a second stage cooler thermally coupled to the superconductor to cool the superconductor down to a superconducting temperature.

13. The method according to claim 12, wherein the superconducting temperature is approximately 4 degrees K.

14. The method according to claim 12, wherein the superconductor includes a magnet employed in a magnetic resonance device.

15. The method according to claim 12, wherein the working gas is Helium gas.

16. The method according to claim 12, wherein the working gas is one of Hydrogen gas, Neon gas, or Nitrogen gas.

17. The method according to claim 13, further including:
the working gas ceasing to flow between the first and second heat exchangers when the second heat exchanger is colder than the first heat exchanger, thermally isolating the first and second heat exchangers.

18. A magnetic resonance method comprising:
cooling a superconducting magnet using the method according to claim 12;
generating a magnetic field in an examination region using the superconducting magnet;
inducing resonance in a subject in the examination region;
receiving resonance signals from the examination region; and
processing the resonance signals.

19. The magnetic resonance method according to claim 18, wherein processing the resonance signals includes reconstructing an image from the resonance signals, and further including:
displaying the image on a display monitor.

20. An apparatus for cooling a superconducting magnet to an operating temperature, including
means for cooling a working gas to approximately 25 degrees K;
means for permitting the working gas to circulate and carry heat away from the superconducting magnet via convection until the superconducting magnet is approximately 25 degrees K;
means for cooling the superconducting magnet from approximately 25 degrees K down to approximately 4 degrees K, and maintaining the superconducting magnet at approximately 4 degrees K during operation.

* * * * *